United States Patent
Kang et al.

(10) Patent No.: US 8,378,487 B2
(45) Date of Patent: Feb. 19, 2013

(54) WAFER LEVEL CHIP PACKAGE AND A METHOD OF FABRICATING THEREOF

(75) Inventors: Teck-Gyu Kang, San Jose, CA (US);
Belgacem Haba, Saratoga, CA (US);
Guilian Gao, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/356,752

(22) Filed: Jan. 24, 2012

(65) Prior Publication Data

US 2012/0126407 A1  May 24, 2012

Related U.S. Application Data

(62) Division of application No. 11/522,885, filed on Sep. 18, 2006, now Pat. No. 8,133,808.

(51) Int. Cl.
*H01L 21/44* (2006.01)

(52) U.S. Cl. .. 257/737; 257/692; 257/738; 257/E23.069

(58) Field of Classification Search .................. 257/686, 257/690, 692, 697, 737–738, E23.069
See application file for complete search history.

(56) References Cited

U.S. PATENT DOCUMENTS

| | | | |
|---|---|---|---|
| 6,051,489 A | 4/2000 | Young et al. | |
| 6,054,171 A | 4/2000 | Shoji | |
| 6,225,206 B1 | 5/2001 | Jimarez et al. | |
| 6,284,563 B1 | 9/2001 | Fjelstad | |
| 6,291,331 B1 | 9/2001 | Wang et al. | |
| 6,437,441 B1 | 8/2002 | Yamamoto | |
| 6,822,317 B1 | 11/2004 | Inoue et al. | |
| 7,176,043 B2 | 2/2007 | Haba et al. | |
| 7,246,432 B2 | 7/2007 | Tanaka et al. | |
| 2003/0067755 A1 | 4/2003 | Haimerl et al. | |
| 2004/0192024 A1 | 9/2004 | Ito | |
| 2004/0245612 A1 | 12/2004 | Hashimoto | |
| 2005/0173805 A1 | 8/2005 | Damberg et al. | |
| 2005/0181655 A1 | 8/2005 | Haba et al. | |
| 2006/0288572 A1* | 12/2006 | Tanaka et al. | 29/846 |

FOREIGN PATENT DOCUMENTS

WO   2007133806   11/2007

OTHER PUBLICATIONS

International Search Report, PCT/US2007/020038.

* cited by examiner

*Primary Examiner* — Thanhha Pham
(74) *Attorney, Agent, or Firm* — Lerner, David, Littenberg, Krumholz & Mentlik, LLP

(57) ABSTRACT

Wafer level chip packages including risers having sloped sidewalls and methods of fabricating such chip packages are disclosed. The inventive wafer level chip packages may advantageously be used in various microelectronic assemblies.

5 Claims, 9 Drawing Sheets

WAFER LEVEL CHIP PACKAGE AND A METHOD OF FABRICATING THEREOF

CROSS-REFERENCE TO RELATED APPLICATIONS

The present application is a divisional of U.S. patent application Ser. No. 11/522,885, filed Sep. 18, 2006, the disclosure of which is incorporated by reference herein.

FIELD OF THE INVENTION

The present invention generally relates to microelectronic elements such as packaged chips and to methods of fabricating microelectronic elements.

BACKGROUND OF THE INVENTION

Semiconductor devices are commonly formed by processing a relatively large flat wafer of semiconductor material to form chip regions including electronic circuits to be incorporated in a single chip. Each chip typically has contacts exposed at a front surface of the wafer and electrically connected to the circuit elements of the chip. To release individual chips, the wafer is severed along predefined saw lanes.

A chip is commonly provided with a chip package. The chip package provides environmental and mechanical protection to the chip and facilitates connectivity between the chip and external circuitry such as, for example, a printed circuit board or other external circuit panel. It has been proposed to fabricate the chip packages by providing, on the front surface of a wafer, some or all structures constituting the package before severing the substrate. This approach is commonly referred to as "wafer level" packaging of the chips.

A packaged chip commonly includes a dielectric structure and electrical terminals disposed on the dielectric structure and connected to contact pads of the chip. The terminals may be disposed at a greater spacing, or pitch, than the contact pads so that the packaged chip can be readily mounted on a circuit panel by solder-bonding the terminals to the corresponding contacts of a circuit panel. In some instances, the terminals may be movable to some extent relative to the body of the chip.

Movable terminals can reduce stress in the solder bonds between the terminals and contacts of the circuit panel. Such stress may arise due to factors such as differences in thermal expansion or contraction of the chip and the circuit panel during the fabrication or service of the assembly.

It has been proposed to form compliant posts on the front surface of a wafer, and form metallic conductors leading from the contacts of the wafer, up the side walls of the posts to terminals disposed on the tips of the posts, and then sever the wafer to provide individual packaged chips. The compliance of the posts allows the terminals to move relative to the chip. In some cases, however, the traces extending on the side walls of the posts are susceptible to fatigue failure in service.

Despite considerable effort in the art heretofore devoted to development of wafer level chip packages and methods of fabricating such packages, further improvements would be desirable.

SUMMARY OF THE INVENTION

One aspect of the present invention provides methods of fabricating microelectronic element such as packaged chips. A method according to this aspect of the invention preferably uses a substrate having a front surface and posts projecting from said front surface, the posts having sidewalls. The method desirably includes the step of applying a first dielectric material to the front surface of the substrate so that the dielectric material is deposited on the sidewalls of the posts. The posts and dielectric material form risers having sloping surfaces defined by the first dielectric material. The first dielectric material may be applied in a flowable condition, as, for example, by spin-coating the substrate. The substrate may be a wafer incorporating a plurality of semiconductor chips, and may have contacts exposed at its front surface. The method desirably further includes the step of forming electrically conductive traces extending from the contacts to the tips of the risers over the sloping surfaces of the risers.

Other aspects of the present invention provide wafer level chip packages such as those fabricated using the disclosed method. Still further aspects of the invention provide microelectronic assemblies including wafer level chip packages.

The Summary is neither intended nor should it be construed as being representative of the full extent and scope of the present invention, which additional aspects will become more readily apparent from the detailed description, particularly when taken together with the appended drawings.

BRIEF DESCRIPTION OF THE DRAWINGS

Herein, identical reference numerals are used, where possible, to designate identical elements that are common to the figures. The images in the drawings are simplified for illustrative purposes and are not depicted to scale.

DETAILED DESCRIPTION

A method according to one embodiment of the invention includes processing steps performed during fabrication of a wafer level chip package (referred to hereafter as "WLCP"). In some embodiments, these processing steps are performed in the order discussed herein. In alternate embodiments, at least two of these processing steps may be performed contemporaneously or in a different order. Sub-steps and auxiliary procedures (e.g., substrate transfers between processing reactors, substrate cleaning routines, process control sub-steps, and the like) are well known in the art and, as such, herein are omitted.

The method according to this embodiment uses a substrate 200, which may be, for example, a semiconductor wafer, a portion of such a wafer or an analogous structure such as a glass or ceramic plate which has been processed to form electronic circuits (not shown) in pre-determined regions of the substrate. Herein such regions of the substrate 200 are interchangeably referred to as "chip regions" or "chips," and the substrate 200 comprises at least one such region. Typically, the substrate includes a plurality of chip regions. The area 211 shown in FIG. 2 corresponds to a portion of one chip region. For coupling to external devices, the circuits formed on the substrate 200 are provided with contact pads 220. The front surface 201 of the substrate may include a dielectric coating (not shown) commonly referred to as a "passivation layer," which protects and insulates elements of the circuits fabricated on the substrate, but exposes the pads 220. Although the pads 220 are depicted in FIG. 2 as projecting above the surrounding surface, this is not essential; the pads may be flush with the surrounding surface or recessed relative to the surrounding surface.

Figure 1:
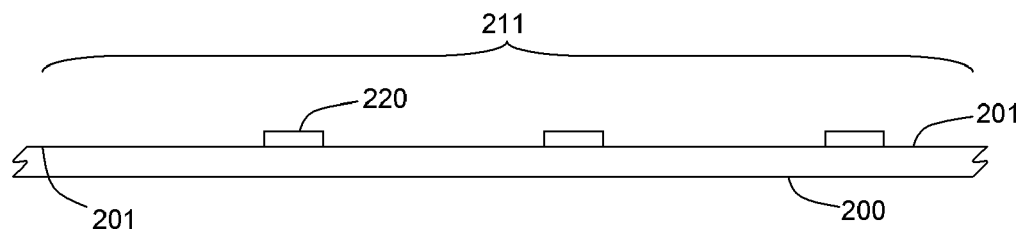
FIGS. 1-4 are schematic, cross-sectional views of a portion of a wafer level semiconductor chip package during successive stages of a method according to one embodiment of the invention.
Figure 2:
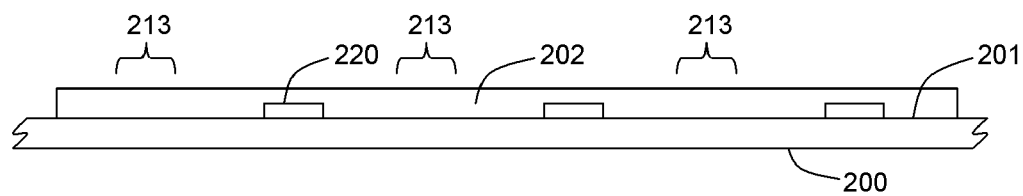
Figure 3:
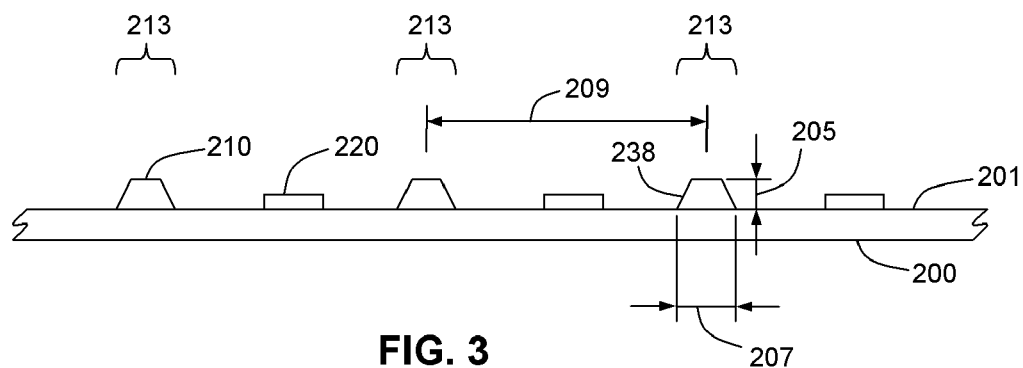
Figure 4:
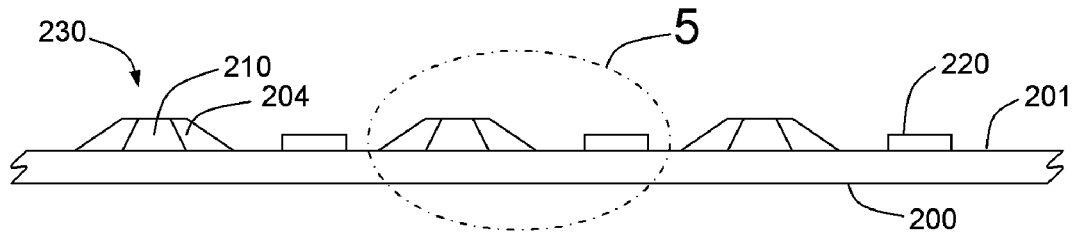

In one step of the method, posts 210 are formed in regions 213 of the front surface 201 of substrate 200 (FIGS. 2-4).

The posts 210 preferably are formed from a dielectric material. Preferably, such materials have elastic moduli lower than an elastic modulus of the material of the substrate 200 or material layers disposed beneath or proximate the posts 210. Posts 210 may be formed from photoimageable materials. For example, photoimageable silicon-based dielectrics, epoxies, polyimides, or combinations thereof, among other photoimageable dielectric materials, may be used to form the posts 210.

The posts 210 may by fabricated using processes conventionally used in production of integrated circuits. For example, the posts 210 may be fabricated using a process of depositing a layer 202 of the photoimageable dielectric material (FIG. 3) by a process such as spin-coating or spraying the material in a flowable condition or laminating a dry film of the material onto the front surface. After applying layer 210, the layer may be patterned by performing a conventional lithographic routine which may include selectively exposing the material to light and optionally other treatments so as to cure only the material which is to form the posts while leaving material in other regions uncured, and then washing or etching layer 202 with a stripping solvent which removes the uncured material. This leaves the posts 210 and removes the material disposed between the posts 210.

Figure 6:
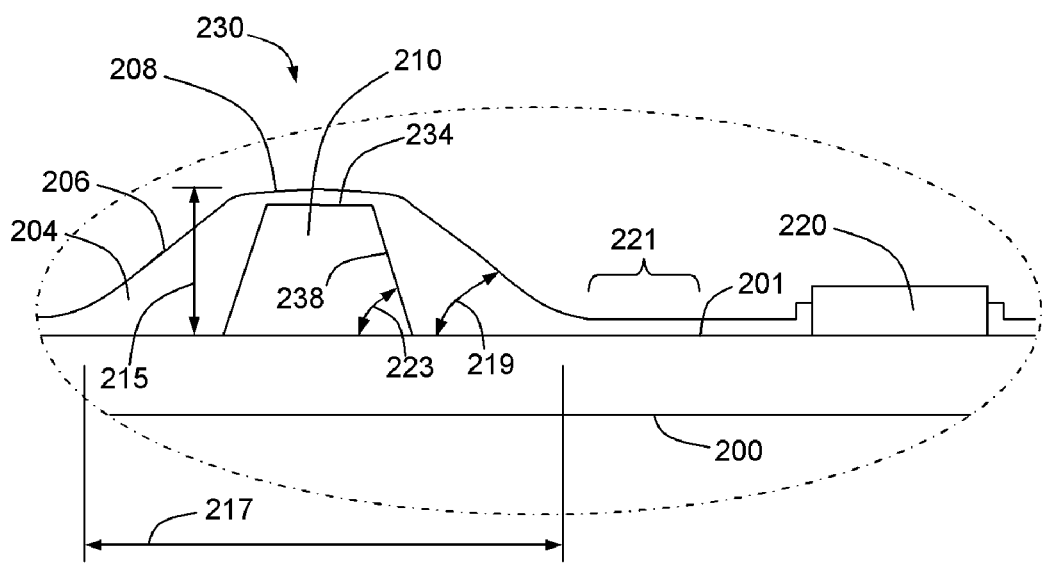
FIG. 6 is a detail view similar to FIG. 6 showing the same area at a later stage in the method.
Figure 7:
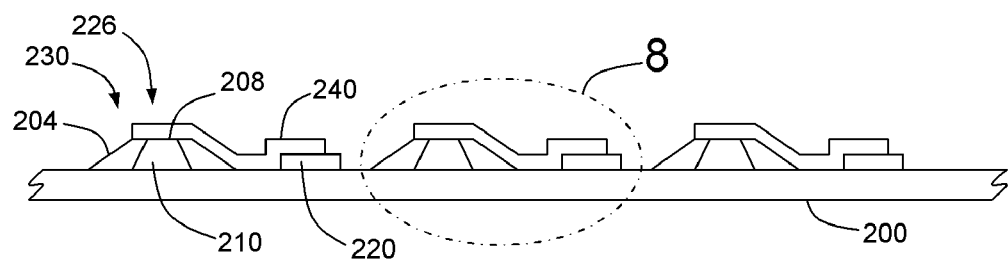
FIG. 7 is a view similar to FIGS. 1-4 showing the package at a later stage in the method.

Typically, the posts 210 have heights 205 and widths 207 in a range from about 5 to 200 μm and 100 to 1000 μm, respectively. The posts most preferably are of uniform height. Such uniformity is readily achieved, inasmuch as the heights of the posts correspond to the thickness of the original layer 202. As best seen in FIG. 7, posts 210 have side walls 238 inclined at a relatively large, steep angle 223 to the front surface 201 of the substrate. For example, the side walls 238 of the posts may be perpendicular or nearly perpendicular to the front surface. This relatively steep angle results from typical photolithographic patterning processes. The locations of the posts 210 and distances 209 between the adjacent posts are selected to facilitate mounting of the WLCP to a circuit panel or other element as discussed below in reference to FIG. 6. The posts preferably are offset from the contacts 220 in horizontal directions, i.e., directions parallel to the front surface 201 of the substrate. In the particular embodiment depicted in FIG. 3, the posts are interspersed with the contacts, so that each post is disposed between the adjacent contacts, this is not essential; in other embodiments, each chip region may have a group of contacts and a group of posts may be formed on another part of the front surface in such chip region. For example, the contacts may be provided in rows, one or more groups of posts may be formed remote from such rows.

Figure 5:
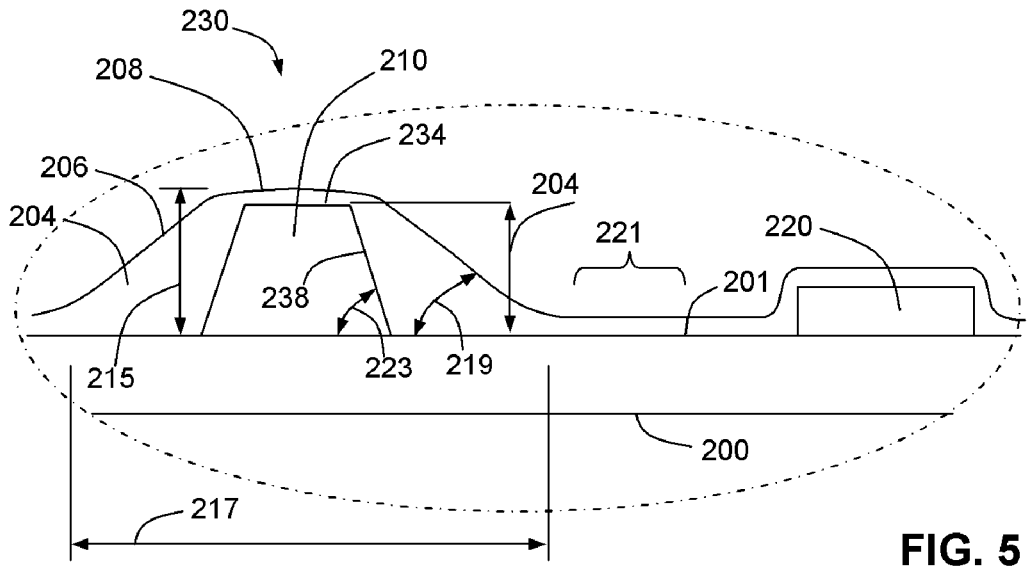
FIG. 5 is a detail view of the area indicated in FIG. 4.

After the posts have been formed, a first dielectric layer 204 (FIGS. 5 and 6) is deposited on the substrate 200. In this embodiment, dielectric layer 204 is formed by depositing the dielectric material in a fluent, flowable condition as, for example, in a liquid state, and then curing the material to a solid condition. The flowable material most preferably wets the posts 210 and the front surface 201 of the substrate. The flowable material can be deposited by processes such dipping, spraying or spin-coating, most typically by spin-coating. The thickness of layer 204 is selected so that in areas remote from the posts 210, the thickness of the layer is less than the height 205 of the posts. The fluid material clings to the side walls 238 of the posts and thus forms menisci 206 extending up the posts and surrounding the posts. As depicted in FIG. 6, a small amount of the fluid material may remain on the tops 234 of the posts. However, this amount is greatly exaggerated in FIG. 6 for clarity of illustration; most preferably, the amount of fluid material remaining on the tops of the posts does not appreciably add to the height of the posts. Depending on the conditions of fluid application, the menisci 206 may terminate at or just below the tops of the posts, leaving no fluid material on the tops of the posts.

The fluid material is cured to form the solid layer 204. Those portions of the material surrounding the posts 210 merge with the posts and form composite risers 230. The menisci 206 constitute sloping surfaces of the risers, and provide smooth paths from tops 234 of the posts 210 into adjacent regions 221. In the depicted embodiment, the dielectric layer 204 covers the tops 234 of the posts 210 where it forms tips 208 of the risers 230. The sloping surfaces 206 of the risers 230 have slope angle 219 with the front surface 201 of the substrate 200. The angle 219 is smaller than the slope angle 223 between the sidewalls 238 of the posts 210 and the device front surface 201. Therefore, the sloping surfaces 206 of the risers 230 are disposed at a lesser angle 223 to the front surface 201 than the sloping surfaces 238 of the posts 210 and provide a gradual and smooth descent from the tips 234 towards the front surface.

The risers 230 smaller aspect ratios than the posts 210. Herein the term "aspect ratio" defines a ratio of a height of a feature, such as the post 210 or the riser 230, to its width. Specifically, a ratio of the height 215 (FIG. 6) of the riser 230 to the width 217 of the riser is smaller than the ratio of the height 205 of the post 210 to its width 207.

The amount of fluid material deposited, its fluid properties such as viscosity, surface tension, and interfacial tension with the substrate and posts, as well as the conditions of deposition such as the rotation rate in spin-coating influence the thickness and configuration of dielectric layer 204, including menisci 206. Also, the rate at which the fluid material is cured to a solid condition may have an influence. However, for given process conditions, the thickness and configuration of layer 204 normally are repeatable and hence readily controllable. Moreover, the thickness and configuration tend to be uniform over the different regions of a large substrate such as a wafer. Provided that posts 201 have a uniform height prior to application of layer 204, the resulting risers 230 also have uniform height.

As deposited, the first dielectric layer 204 may cover the contacts 220, as depicted in FIG. 6. During or after formation of the risers 230, the substrate 200 is patterned to expose the contact pads 220 as seen in FIG. 7. The contacts 210 may be exposed by a selective etching process. If the first dielectric layer 204 is formed from a photoimageable material, the contacts can be exposed by selectively exposing the layer to light so as to leave the material overlying the contacts uncured, and stripping the uncured material.

Figure 8:
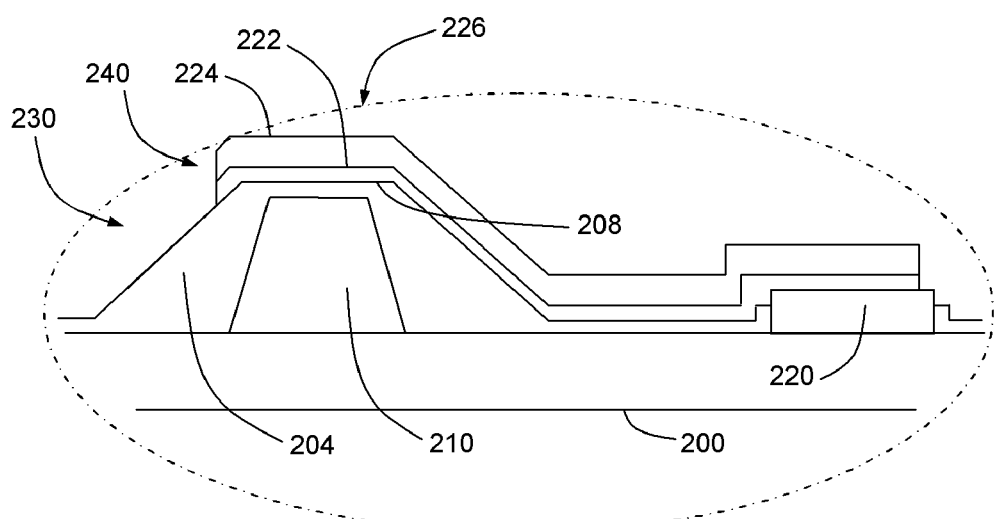
FIG. 8 is a detail view of the area indicated in FIG. 7.
Figure 9:
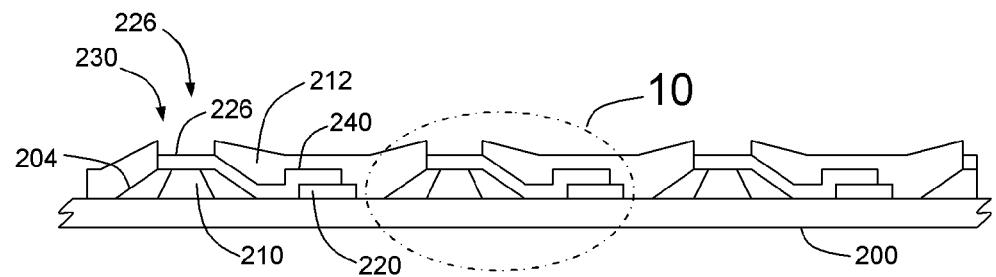
FIG. 9 is a view similar to FIG. 7 showing the package at a later stage in the method.

After the risers are complete, conductive lines 240 (FIGS. 8 and 9) are formed between the tips 208 of the risers 230 and the contact pads 220. The conductive lines can be formed by any process capable of selectively forming conductive structures on a dielectric. In one embodiment, a seed layer 222 is deposited on the first dielectric layer 204 (e.g., using a sputtering process), a conductive layer 224 is deposited on the seed layer 222 (e.g., using a sputtering or electroplating plating process), and then the layers 222 and 224 are patterned to form the lines 240. During a patterning process, the layers 222 and 224 are etched through an etch mask which covers the regions which are to form conductive lines 240.

The seed layer 222 provides an adhesive bond between the first dielectric layer 204 and conductive lines 240. The layer 222 may comprise, for example, nickel (Ni) containing alloys, such as CrNi, NiCo, and the like, whereas the conductive layer 224 may be formed from copper (Cu), aluminum (Al), Ni, and alloys thereof, among other conductive materials. Conductive layer 224 may include two or more sub-layers as, for example, a thin layer of gold or other oxidation-resistant metal over an underlying layer of copper or other base metal.

Typically, the conductive lines 240 have widths and thicknesses in a range from about 5 to 100 μm and 5 to 50 μm, respectively. In the depicted embodiment, the conductive lines 240 extend over the tips 208 of the risers 230, thereby forming terminals 226 of the WLCP being fabricated. The gently sloping surfaces 206 of risers 230 facilitate formation of the conductive lines with substantially uniform thickness. Moreover, because the conductive lines follow the gently sloping surfaces, they are free of sharp bends. This is desirable because sharp bends tend to concentrate stresses applied to the leads.

Figure 10:
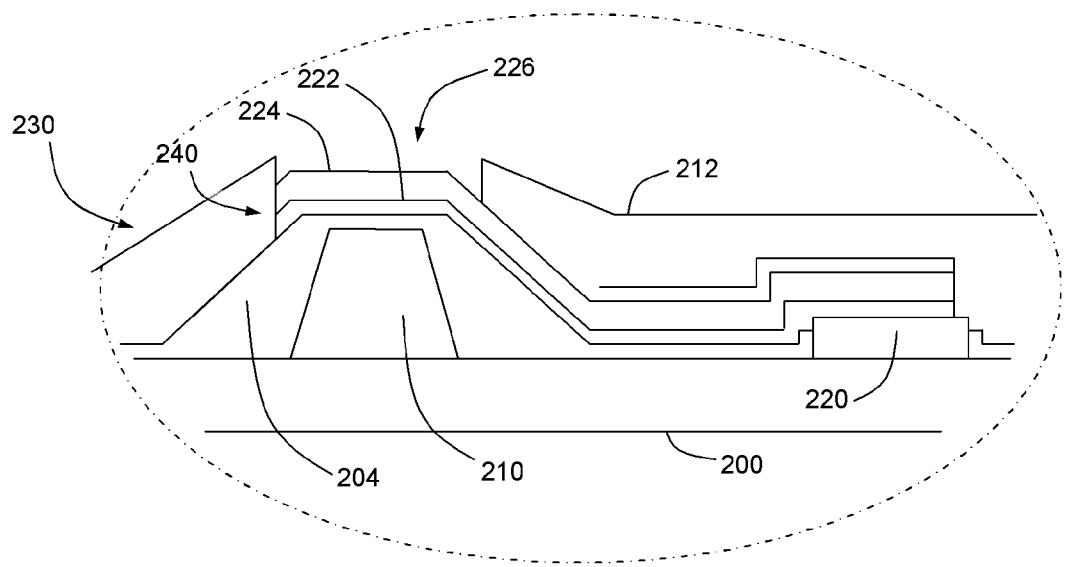
FIG. 10 is a detail view of the area indicated in FIG. 9.
Figure 11:
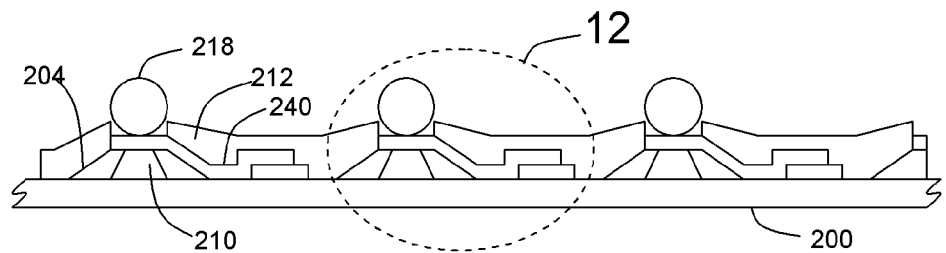
FIG. 11 is a view similar to FIG. 9 showing the package at a later stage in the method.

At step 110, a second dielectric layer or solder mask 212 (FIGS. 10 and 11) is deposited on the substrate 200, over the first dielectric layer 204 and conductive lines 240. The second dielectric or solder mask layer is patterned to expose the contact terminals 226 (FIGS. 10-11). The second dielectric layer may be formed, for example, by depositing a conventional photoimageable solder mask material and patterning processes as discussed above in reference to fabrication of the posts 210 from such materials. The solder mask or second dielectric layer protects the conductive lines 240 from wetting by solder during mounting the WLCP as discussed below. The second dielectric layer 212 embeds and protects the conductive lines 240 and contact pads 220. In some embodiments, the second dielectric layer 212 is not needed and, as such, is optional. For example, if the metals constituting conductive lines 240 and terminals 226 provide an exposed copper surface on lines 240 and a gold surface on terminals 226, an oxide coat forms on lines 240 but not on terminals 226. In certain fluxless soldering processes, the oxide coat remains non-wettable by solder, so that a separate solder mask is not needed. Also, if the terminals 226 are to be connected to external elements by processes other than soldering, the solder mask or second dielectric layer may be omitted.

Figure 12:
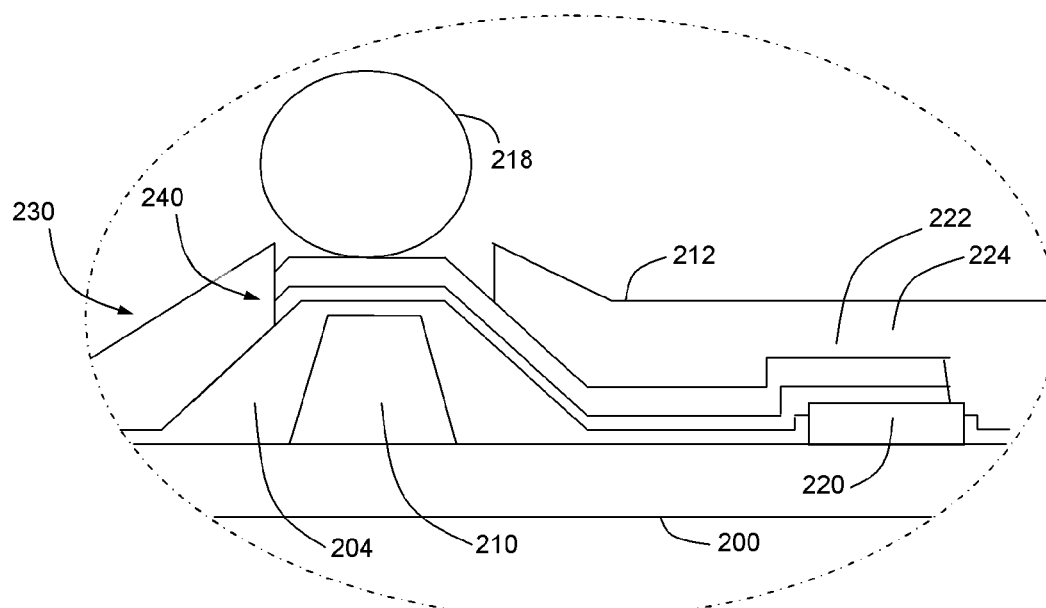
FIG. 12 is a detail view of the area indicated in FIG. 11.

Masses of a conductive bonding material, such as solder balls 218, are attached to at least some of the contact terminals 226 (FIGS. 11 and 12). The solder balls 218 may by attached using conventional operations of the type commonly used for surface mounting of chip packages to circuit boards.

Before or after the solder balls 218 have been attached, the substrate 200 is severed and into individual WLCPs. Each WLCP includes a chip having risers 230 projecting from its front surface and having solder balls 218 projecting from the terminals 226 at the tips of the risers.

The WLCPs can be tested by engaging the terminals with a test fixture (not shown). Such testing can be performed before or after mounting the solder balls to the terminals, and can be performed before or after the severing step. It is desirable to engage all of the terminals 226, or all of the solder balls, of each WLCP with corresponding contacts of the test fixture simultaneously. As the terminals or solder balls are engaged with the contacts of the test fixture, the risers 230 can deform to some extent, to allow movement of the terminals towards and away from the front surface 201 of the chip.

Figure 13:
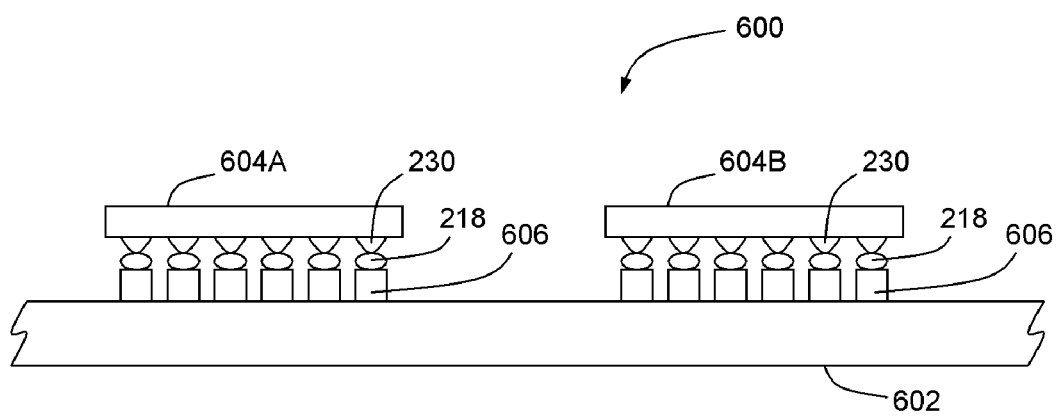
FIG. 13 is schematic, cross-sectional view of a portion of a microelectronic assembly including wafer level chip packages fabricated according to the method of FIGS. 1-12.

The WLCPs can be assembled to a circuit panel or other element. FIG. 13 depicts a schematic, cross-sectional view of a portion of a microelectronic assembly 600 including a circuit board 602 and WLCPs 604A and 604B fabricated according to the method of FIGS. 1-12. In the depicted embodiment, the WLCPs 604A and 604B are mounted on contact pads 606 of the circuit board 602 by heating the assembly to reflow the solder balls 218 so that the solder material wets the corresponding contacts 606 of the circuit board 602, and then cooling to solidify the solder. The solder bonds the terminals 226 (FIGS. 12 and 13) to the contact pads 606 and thus electrically and mechanically connects the terminals to the circuit board 602.

During use, and during the mounting process, the assembly can be subjected to differential thermal expansion and contraction of the chips and circuit panel. For example, factors such as heat evolved by the assembly during operation and changes in ambient temperature cause repeated heating and cooling during use. A chip typically will expand or contract by a different amount than the circuit board. Deformability of the risers 230 allows the terminals 226 to move relative to the chip. Such movement alleviates stresses which would otherwise be applied to the solder balls. However, such movement requires flexing of the conductive lines 240. Repeated flexing tends to cause metal fatigue. However, the configuration of the conductive lines tends to make them resistant to fatigue. As discussed above, the lines can be formed without stress concentrations due to sharp bends or corners, and without thin spots. The fatigue-resistant leads in turn contribute to the reliability of the assembly.

In the embodiments discussed above, the posts and risers are generally cylindrical or conical. However, this is not essential. In other embodiments, at least some of the posts 210 and the risers 230 may have other shapes. For example, the posts may be formed as elongated structures extending, for example, in the direction orthogonal to the cross-sections of substrate 200 depicted in the drawings.

Figure 14:
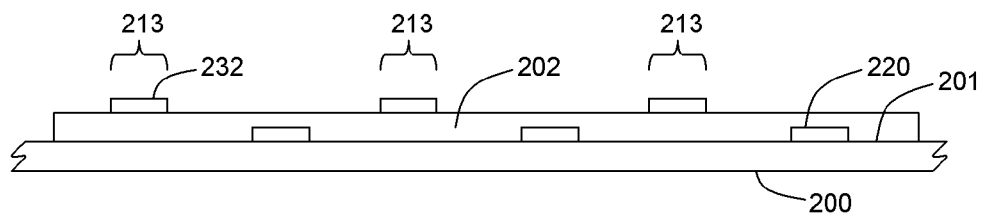
FIGS. 14-16 are schematic, cross-sectional views of a portion of a wafer level semiconductor chip package during successive stages of a method according to another embodiment of the invention.
Figure 15:
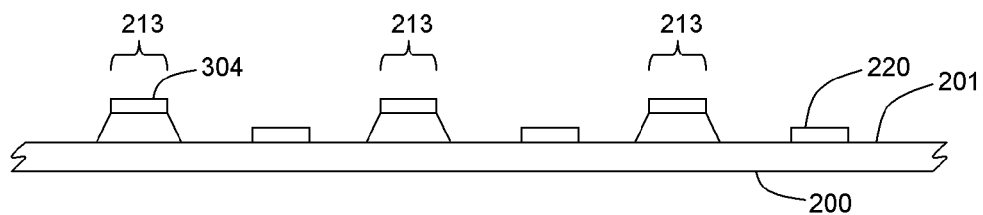
Figure 16:
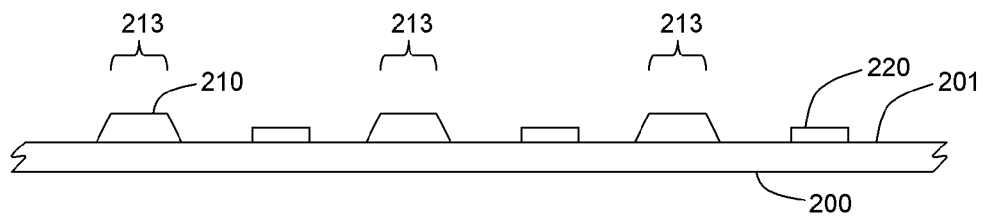

In a method according to a further embodiment of the invention, the posts 210 may be fabricated from a non-photoimageable material. In such embodiment, after the material is deposited using, for example, spin-coating or spraying processes, photoresist etch masks 304 are formed on the deposited layer 202 at the locations 213 of the posts 210 being fabricated (FIG. 14). Then the layer is etched through the photoresist etch masks 304 (FIG. 15), followed by a conventional process of removing the masks 304 (FIG. 16).

In a further embodiment, the posts can be formed by processes such as stenciling a flowable material onto the front surface of the substrate. Other processes used in production of integrated circuits may be used to fabricate the posts 210 or risers 230. Moreover, although the embodiments discussed above include formation of the posts on the substrate as part of the method, the method also can be practiced where the posts are provided along with the substrate. For example, the posts may be formed during formation of a wafer as part of a passivation layer forming the front surface of the wafer. As discussed above, posts and risers formed from compliant materials facilitate movement of the terminals relative to the chip in the finished WLCP, and thus relieve stress in the bonds between the terminals and circuit panel. However, the methods and structures discussed above can be used with other materials to provide substantially rigid, non-compliant risers with contacts thereon.

Figure 17:
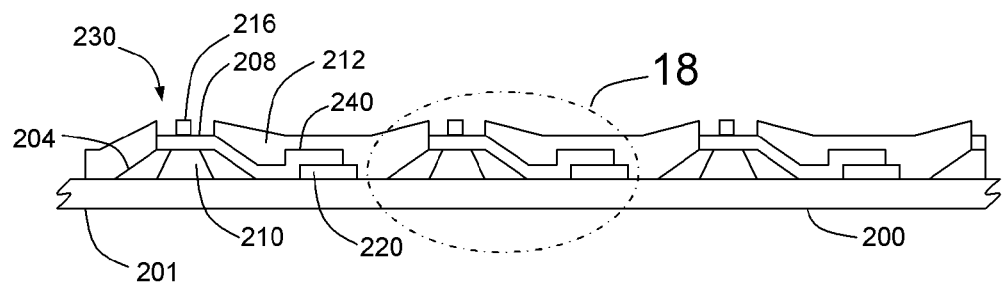
FIG. 17 is a view similar to FIG. 16 but depicting a package according to a further embodiment of the invention.
Figure 18:
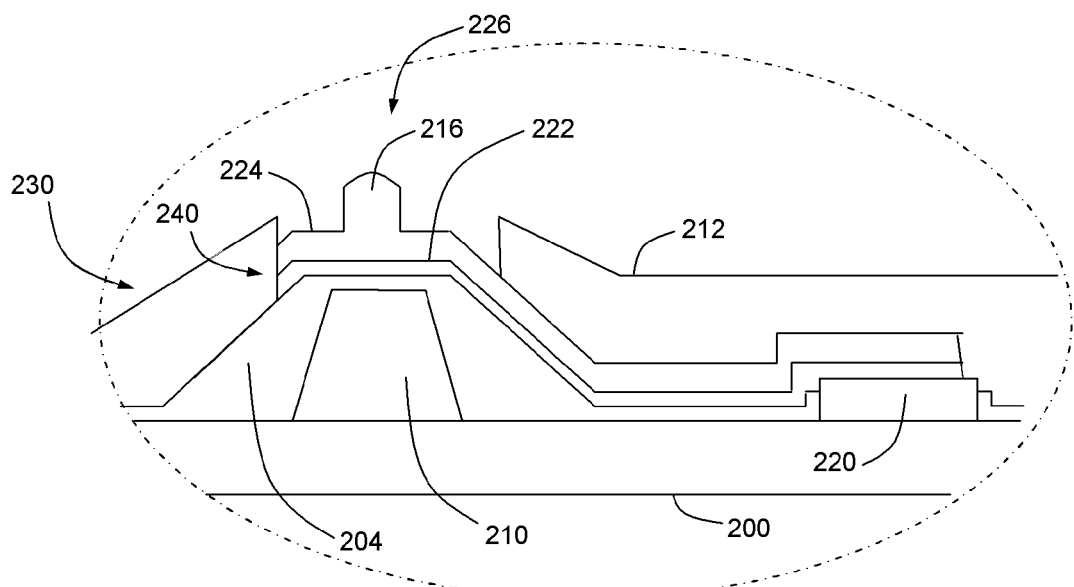
FIG. 18 is a detail view of the area indicated in FIG. 17.

In a further embodiment of the invention, (FIGS. 17 and 18) contact pins 216 are formed on the contact terminals 226 of the conductive lines 240. The pins 216 may be fabricated, for example, from copper using a plating process. The contact pins desirably project upwardly above the solder mask or second dielectric layer 212. The contact pins can be engaged with a test fixture to test the WLCP and then solder-bonded or otherwise engaged with a circuit panel to permanently mount the WLCP to the panel. As disclosed, for example, in United States Patent Publication Nos. 2005/0181544A1, (now U.S. Pat. No. 7,176,043,) 2005/0181655A1, and 2005/0173805A1, the disclosures of which are hereby incorporated by reference herein, such pins can facilitate engagement with the test fixture.

Figure 19:
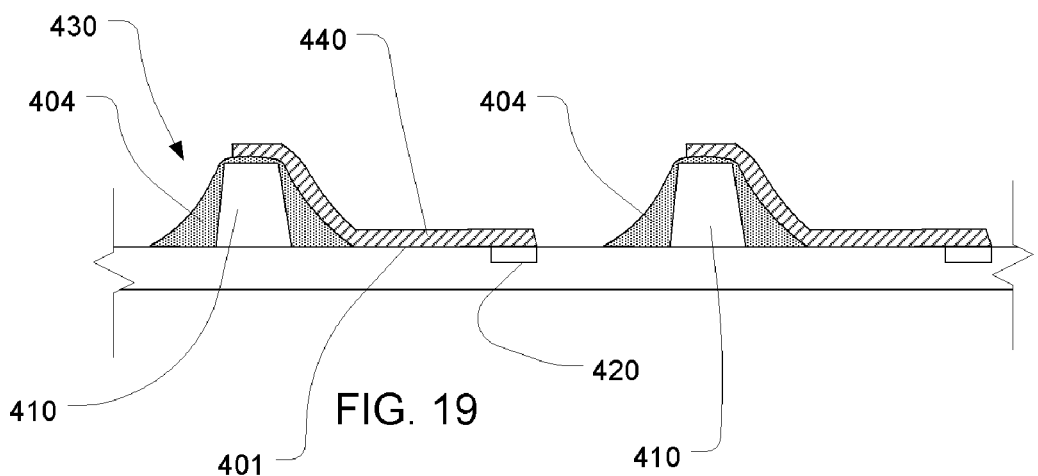
FIGS. 19 and 20 are fragmentary sectional views depicting portions of chip packages according to a further embodiment of the invention.

In the embodiments discussed above, the first dielectric layer which forms the sloping surfaces of the risers is a substantially continuous layer covering portions of the front surface of the substrate remote from the posts and risers. However, this is not essential. For example, as seen in FIG. 19, the first dielectric layer 404 is provided only around the posts 410, so that portions of the front surface 401 between the risers 430 are not covered by the dielectric material. In this case, the conductive lines 440 may extend from the contacts 420 to the risers, and up the sloping surfaces of the risers to the tops of the risers. A discontinuous layer as shown in FIG. 19 may be formed, for example, by etching or otherwise removing the material of the dielectric layer remote from the risers.

Figure 20:
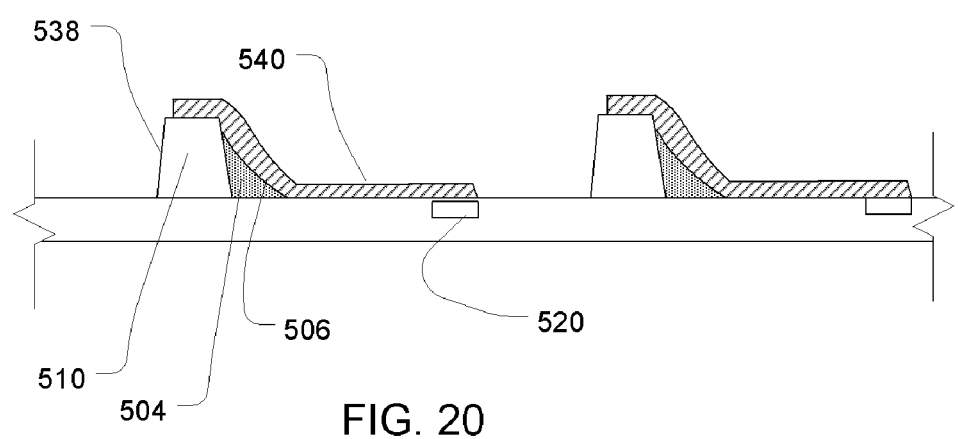

As shown in FIG. 20, the sloping surfaces 506 formed as part of the first dielectric layer need not extend all the way to the tips of the posts 510. Thus, a small part of the conductive lines 540 near the tips of the posts may directly contact the side walls 538 of the posts. As also shown in FIG. 20, the dielectric material 504 and the sloping surfaces 506 of the risers need not extend around the entire periphery of the posts. Thus, in the embodiment of FIG. 20, the sloping surfaces are provided only on those sides of the risers which carry the conductive lines. For example, where the dielectric layer is etched to remove the dielectric material from the contacts 520, parts of the sloping surfaces which are not needed to carry the conductive lines can be removed.

In the embodiments discussed above, the substrate used in the process is a wafer including plural chip regions, and the package is referred to as a "wafer-level chip package" or WLCP. However, other substrates can be employed in the process to form other articles. For example, the substrate may be a single chip, a portion of a wafer, or an assemblage of plural separate chips mounted on a carrier. Further, substrates which do not include semiconductor chips can be used. For example, the substrate can be a glass or ceramic element as, for example, a ceramic element with passive electrical devices thereon, commonly referred to as an "integrated passives on chip" or "IPOC." Also, the substrate can be a large wafer-like element incorporating plural IPOCs. In yet another variant, the substrate may be a circuit panel.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A packaged chip comprising:
    a semiconductor chip having a front surface, contact pads exposed at said front surface, and posts projecting upwardly from said front surface, said posts having sidewalls;
    a first dielectric material disposed on the front surface of the chip and on the sidewalls of the posts so that the first dielectric material and the posts form risers, each riser including a post and having a sloping surface defined by the first dielectric material, the sloping surfaces of each riser as a whole being disposed at a lesser angle to the front surface than the sidewall as a whole of the post included in the riser, said risers having tips;
    conductive lines propagating from the contact pads to the tips of the risers and extending over said sloping surfaces of the risers; and
    terminals terminating the conductive lines, said terminals being disposed on the tips of the risers.

2. The package of claim 1 wherein elastic moduli of the posts and the first dielectric material are lower than an elastic modulus of the chip.

3. The package of claim 1 further comprising solder balls attached to at least some of the terminals.

4. The package of claim 1 wherein at least some of the terminals comprise contact pins.

5. An assembly including the packaged chip of claim 1 and a circuit panel having contact pads, the terminals of said packaged chip being bonded to the contact pads of the circuit panel.

* * * * *